(12) United States Patent
Alphonse

(10) Patent No.: US 6,937,780 B2
(45) Date of Patent: Aug. 30, 2005

(54) MULTI-PASS, ARCUATE BENT WAVEGUIDE, HIGH POWER SUPER LUMINESCENT DIODE

(75) Inventor: Gerard A. Alphonse, Princeton, NJ (US)

(73) Assignee: Trumpf Photonics, Inc., Cranbury, NJ (US)

( * ) Notice: Subject to any disclaimer, the term of this patent is extended or adjusted under 35 U.S.C. 154(b) by 144 days.

(21) Appl. No.: 10/220,897

(22) PCT Filed: Feb. 23, 2001

(86) PCT No.: PCT/US01/06039

§ 371 (c)(1),
(2), (4) Date: Feb. 5, 2003

(87) PCT Pub. No.: WO01/63331

PCT Pub. Date: Aug. 30, 2001

(65) Prior Publication Data

US 2004/0126063 A1 Jul. 1, 2004

Related U.S. Application Data

(60) Provisional application No. 60/185,133, filed on Feb. 25, 2000.

(51) Int. Cl.[7] .................................................. G02B 6/12
(52) U.S. Cl. .......................................... 385/14; 385/43
(58) Field of Search ............................. 385/14, 43, 32, 385/129–132; 359/326, 328, 344; 257/98; 372/1, 6, 7, 45, 97, 98

(56) References Cited

U.S. PATENT DOCUMENTS

| | | |
|---|---|---|
| 4,901,123 A | 2/1990 | Noguchi et al. |
| 5,321,718 A | 6/1994 | Waarts et al. |
| 5,621,749 A | 4/1997 | Baney |
| 5,745,284 A * | 4/1998 | Goldberg et al. ........... 359/344 |
| 5,793,521 A | 8/1998 | O'Brien et al. |
| 5,912,910 A * | 6/1999 | Sanders et al. ............... 372/22 |
| 5,917,972 A | 6/1999 | Davies |
| 6,091,755 A | 7/2000 | Sanders et al. |
| 6,141,477 A * | 10/2000 | Kitamura .................... 385/131 |
| 6,339,606 B1 | 1/2002 | Alphonse |
| 6,411,757 B1 * | 6/2002 | Brener et al. ................. 385/43 |
| 6,417,524 B1 | 7/2002 | Alphonse |
| 6,430,207 B1 * | 8/2002 | Alphonse .................... 372/98 |

FOREIGN PATENT DOCUMENTS

| | | |
|---|---|---|
| EP | 0318947 A | 6/1989 |
| WO | WO 9747042 | 12/1997 |
| WO | WO 9966613 | 12/1999 |

OTHER PUBLICATIONS

Lin, C. P. et al., "Superluminescent Diodes With Bent Waveguide," IEEE Phototonics Technology Letters, Feb. 1996, vol. 8, No. 2, pp. 206–208.

Semenov, A.T. et al., "Wide Spectrum Single Quantum Well Superluminescent Diodes at 0.8µm With Bent Optical Waveguide," Electronics Letters, May 1993, vol. 29, No. 10, pp. 854–855.

Vogel Verlag K.G., "Optischer Verstaerker mit Niedriger Superlumineszenz," Neus Aus Der Technik, Wurzburg, DE, No. 6, vol. 1, p. 2 (1981) and English translation.

* cited by examiner

*Primary Examiner*—Rodney Bovernick
*Assistant Examiner*—Mike Stahl
(74) *Attorney, Agent, or Firm*—Fish & Richardson P.C.

(57) ABSTRACT

An optical device (300) including first and second facets (340, 350); an at least partially bent waveguide (320) formed on a substrate and including a portion perpendicular to the first facet; and a light amplification region (310) coupled to the bent waveguide. The light amplification region includes an expanding tapered portion and a contracting tapered portion which approaches the second facet.

24 Claims, 7 Drawing Sheets

MULTI-PASS, ARCUATE BENT WAVEGUIDE, HIGH POWER SUPER LUMINESCENT DIODE

RELATED APPLICATION

This application claims priority of U.S. patent application Ser. No. 60/185,133, entitled "DOUBLE-PASS HIGH POWER SUPERLUMINESCENT DIODE (SLD) AND OPTICAL AMPLIFIER WITH MODE STABILIZATION", filed Feb. 25, 2000, the entire disclosure of which is hereby incorporated by reference herein.

FIELD OF INVENTION

The present invention relates generally to optical devices, and particularly to superluminescent diodes (SLD's) and lasers.

BACKGROUND OF INVENTION

There is currently a need for high power SLD's suitable for use as optical amplifiers. It is an object of the present invention to address this need. There is further a need for compact and reliable projections systems. It is another object of the present invention to address this need as well. The invention also enables one to provide and enable external cavity lasers.

SUMMARY OF INVENTION

An optical device including: first and second facets; an at least partially bent waveguide formed on a substrate and including a portion perpendicular to the first facet; and, a light amplification region coupled to the bent waveguide, the light amplification region including an expanding tapered portion and a contracting tapered portion wherein the contracting tapered portion approaches the second facet.

DETAILED DESCRIPTION OF THE PREFERRED EMBODIMENTS

Figure 1:
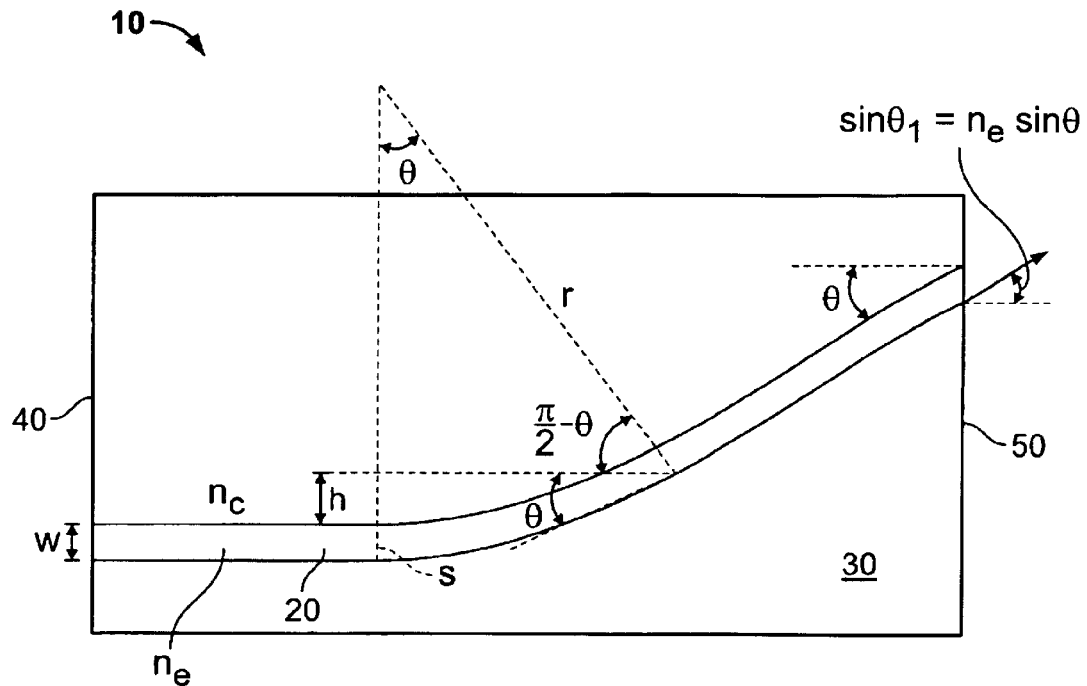
FIG. 1 illustrates a double-pass bent or arcuate waveguide superluminescent diode (SLD) utilized according to an aspect of the present invention.

Referring now to the figures, like references therethroughout designate like elements of the invention. A double-pass or bent waveguide superluminescent diode (SLD) 10 utilized according to one aspect of the present invention is shown in FIG. 1. The SLD 10 includes a ridge waveguide portion 20, having an effective index of refraction $n_e$, along a substrate 30 having an index of refraction $n_c$.

Figure 8:
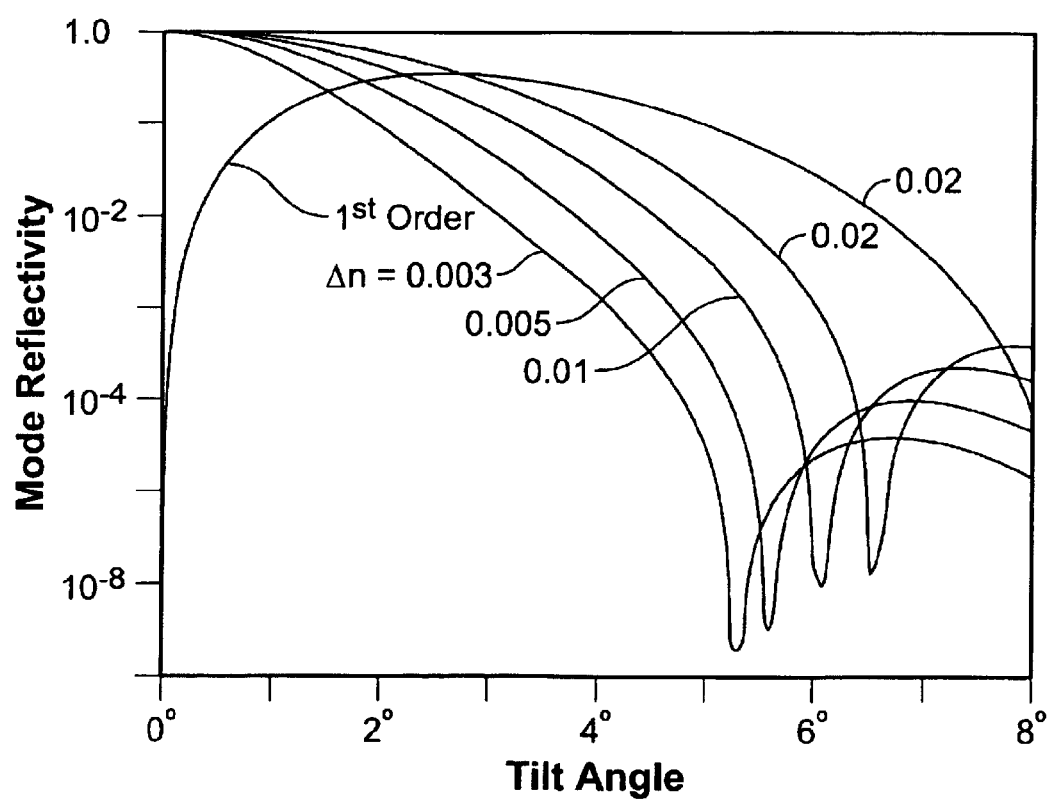

The effective index is obtained from the active layer's bulk index $n_f$ by solving Maxwell's equation with the waveguide's boundary conditions. The SLD 10 includes a first facet 40 having a coating of a prescribed reflection, which may be a highly reflective coating or an anti-reflective (AR) coating and a second facet 50 having an (AR) coating. The lateral index step for the ridge waveguide 20 has a refractive index difference $\Delta n \leq 0.01$ according to an aspect of the present invention. The ridge waveguide 20 width (w) is such as to maintain a single transverse-mode, typically about 3 μm for operating wavelength in the 1000 nm range. Referring now also to FIG. 8, it shows modal reflectivity of an angled stripe SLD at 1550 nm wavelength for several lateral index steps. It should be noted that selecting a tilt angle of $\theta \approx 6°$ (FIG. 1) and a waveguide 20 width (w) (FIG. 1) of about 3 microns, the mode reflectivity is advantageously relatively constant for a $\Delta n$ ranging from approximately 0.003 to approximately 0.01. This advantageously increases manufacturing tolerances for the waveguide 20.

Referring again to FIG. 1, the radius of curvature is given by $$r > \frac{24\pi^2}{\lambda_z^2}|\xi|^3,$$

where $$\lambda_z = \frac{\lambda}{n_e},$$

where $n_e$ is the effective index and $\lambda$ is the wavelength in free space, and $$\xi = \frac{\lambda}{2\pi(n_e^2 - n_c^2)^{1/2}}.$$

This expression can be simplified to $$r > \frac{0.33762\sqrt{n_e}}{(\Delta n)^{3/2}}\lambda,$$

where $\Delta n = n_e - n_c$. The length s of the bent region is given by $s = r\phi$, where $\phi$ is expressed in radians. For a ridge waveguide structure with an angle of 6° (~0.1 radian), the length of the bend region is 0.1r, and a robust angle design with negligible bend loss is one for which r=10 mm and s=1 mm. For a chip of length 1 mm, the whole bent waveguide would simply be a circular arc, and the bend loss would be of the order of 1% or less.

Figure 2:
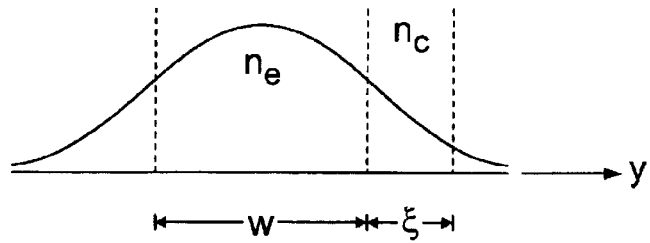
FIG. 2 illustrates a mode propagating through the waveguide of FIG. 1.

This configuration was also described in U.S. Pat. No. 6,430,207, issued on Aug. 6, 2002, and entitled "MULTPLE-WAVELENGTH MODE-LOCKED LASER", the entire disclosure of which is herein incorporated by reference. Referring now also to FIG. 2, there is shown mode propagation through the SLD 10.

A "diamond-like" shaped SLD is taught in U.S. Pat. No. 6,417,524, issued on Jul. 9, 2002, and entitled "LIGHT EMITTING SEMICONDUCTOR DEVICE", also hereby incorporated by reference herein. The "diamond-like" SLD structure thereof is capable of high power operation. This is possible because the walls of the waveguide are non-parallel, so it does not support high order waveguide modes. This allows its fabrication in a volume that is much larger than a conventional narrow stripe SLD, and hence gives it the capability for emitting high power in a single mode.

Figure 3:
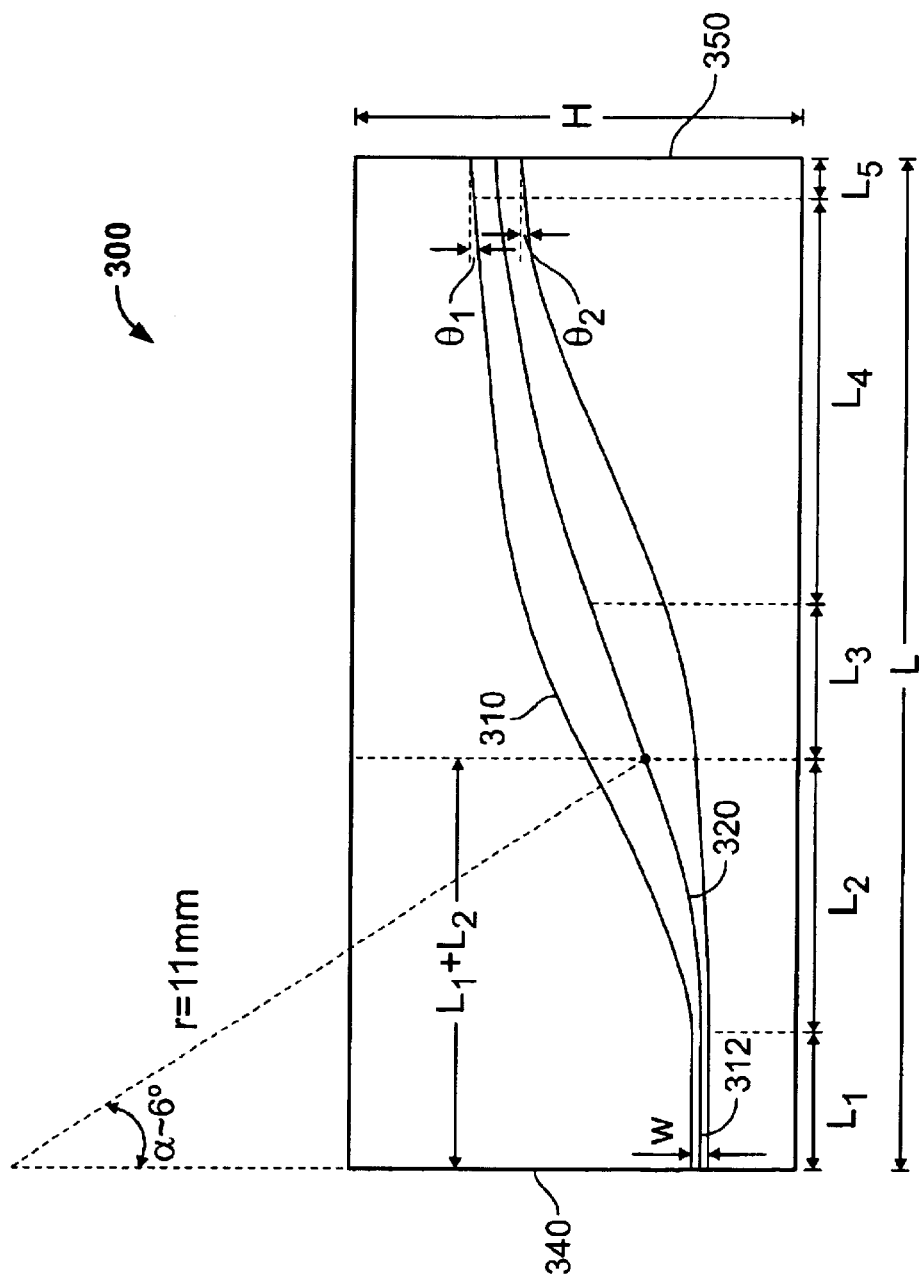
FIG. 3 illustrates a type of waveguide utilized according to yet another aspect of the present invention.

According to the present invention, the bent SLD configuration of FIG. 1 and the aforementioned diamond-like structure are used to produce a high-power single-mode SLD 300 as is shown in FIG. 3, for example. The diamond structure 310, or alternatively a single taper active structure, is placed at an angle .alpha., typically 5 to 10.degree. with respect to the front facet, and connected to a section 312 of narrow single-mode waveguide by means of a bent or arcuate waveguide 320 that is designed analogously to the SLD shown in FIG. 1. According to a preferred form of the present invention, the transition from the narrow waveguide portion to the bent waveguide portion should be gradual and not abrupt. Likewise, it is preferred that the transition from expanding to contracting tapering in the diamond-like region be gradual and not abrupt or point-like. In this configuration 300, the narrow single-mode waveguide 312 is perpendicular to the back facet 340, so that light reflected from the back facet 340 is re-injected into the diamond section or taper 310. The radius of curvature (r) is chosen as prescribed earlier in order to prevent undesirable radiation and hence loss from the curved or bent portion 320 of the waveguide. The width of the narrow waveguide portion 312 near the back facet 340 is such that it preferably propagates only the lowest order mode. This width (w) is preferably about 3 microns for typical ridge laser structures. This further serves to stabilize the propagated mode in the tapers of the portion 310 and further ensure single mode operation.

According to an aspect of the present invention, the back facet 340 is coated with an interference filter that provides high reflectance, for example >95%. In some other aspects, such as some designs of external cavity lasers, it can also be anti-reflection coated. The front facet 350 is coated with an anti-reflection coating to increase output power according to another aspect of the invention. The waveguide layer structure can take the form of any typical laser diode structure including an active emission layer sandwiched between p and n cladding layers deposited epitaxially on a semiconductor substrate (GaAs for wavelength below 1,100 nm, or InP for wavelengths 1,300 nm to 2,000 nm, for example). Therefore, the waveguide structure can be fabricated using a conventional process of photolithography, etching, metallization, and facet coating. Upon application of an electric current to the device, light is created by spontaneous emission, and a small component of it propagates along the waveguide guide where it undergoes gain by stimulated emission and is output as Amplified Spontaneous Emission (ASE).

It should be understood that in a single-pass SLD device, the output light is the guided ASE component emanating from the back end of the structure and propagating with exponential gain toward the front end or output facet. According to another aspect of the present invention though, the output of the device 350 also includes light emanating from the front end 350, propagating toward the back facet 340, being reflected from the back facet 340 and emerging from the front facet 350 after two passes through the structure. As a result, the maximum output power in the double-pass structure 300 is advantageously proportional to the square of the gain of the device, whereas in the single-pass device it is only proportional to the gain. Thus, the double-pass SLD 300 is advantageously a more efficient gain medium than a single-pass device.

Still referring to FIG. 3, the double-pass device 300 thereof also offers advantages in its use as a gain medium in external cavity lasers (ECL). In order to make a laser from the device, in the case where the back facet has a high-reflect coating, all that is needed is to provide a feedback partial reflection from the output facet 350, since high reflection is already provided at the back facet 340.

The laser can be made tunable by using a frequency-selective front feedback, such as provided by a grating. The gain-bandwidth of the SLD at 1550 nm is about 100 nm. This value would also be the tuning range of the laser. In this configuration, the wavelength tuning occurs at the output end. An alternate configuration of the ECL is one in which both front and back facets are anti-reflection coated and in which the external feedback element provides maximum reflection. In this case, the output is taken from the non-angled facet, separating the tuning function from the output function.

One convenient application of the configuration with the high-reflect back coating is in the generation of high power up-conversion light. As will be discussed, using such a configuration one can readily generate high power blue (~460 nm) or green (~520 nm) visible light from a gain medium of the type described herein by emitting radiation in the 910 to 930 nm range or 1020–1040 nm range, respectively.

Still referring to FIG. 3, according to another aspect of the present invention the device 300 can be formed so as to have a length of 2300 $\mu$m and height of 600 $\mu$m. The angle of the diamond structure is preferably about 6°, while the angle $\theta_1$ defining the angle of the upper taper of the section 310 with respect to the output facet 350 is about 5.3°, and the angle $\theta_2$ defining the angle of the lower taper of the section 310 with respect to the output facet 350 is about 6.7°. The tilt angle is between 5 to 7° for a weakly guided angled stripe SLD at 1550 nm. The length of the tapered portion 310 is preferably about 2150 $\mu$m, with $L_2 \approx L_4 \approx 975$ $\mu$m. The taper angle $\theta_3$ is preferably about 2° or less, in order to maintain adiabatic condition, a condition in which very little light is converted to high-order waveguide modes. The transition of the region 310 from tapering in an expanding manner to a contracting manner preferably happens in a length $L_3$ which may be about 200 $\mu$m. The length of the waveguide portion 312 is about 125 $\mu$m, which makes $L_5$ approximately 2300 $\mu$m. In any event, $L_1$ is approximately 125 $\mu$m, $L_2$ is 975 $\mu$m, $L_3$ is 200 $\mu$m, $L_4$ is 975 $\mu$m and $L_5$ is 25 $\mu$m. Thus, the total L is about 2300 $\mu$m. Basically, the length of the arcuate or curved part 310 is selected to minimize radiation at 1555 nm.

Figure 4:
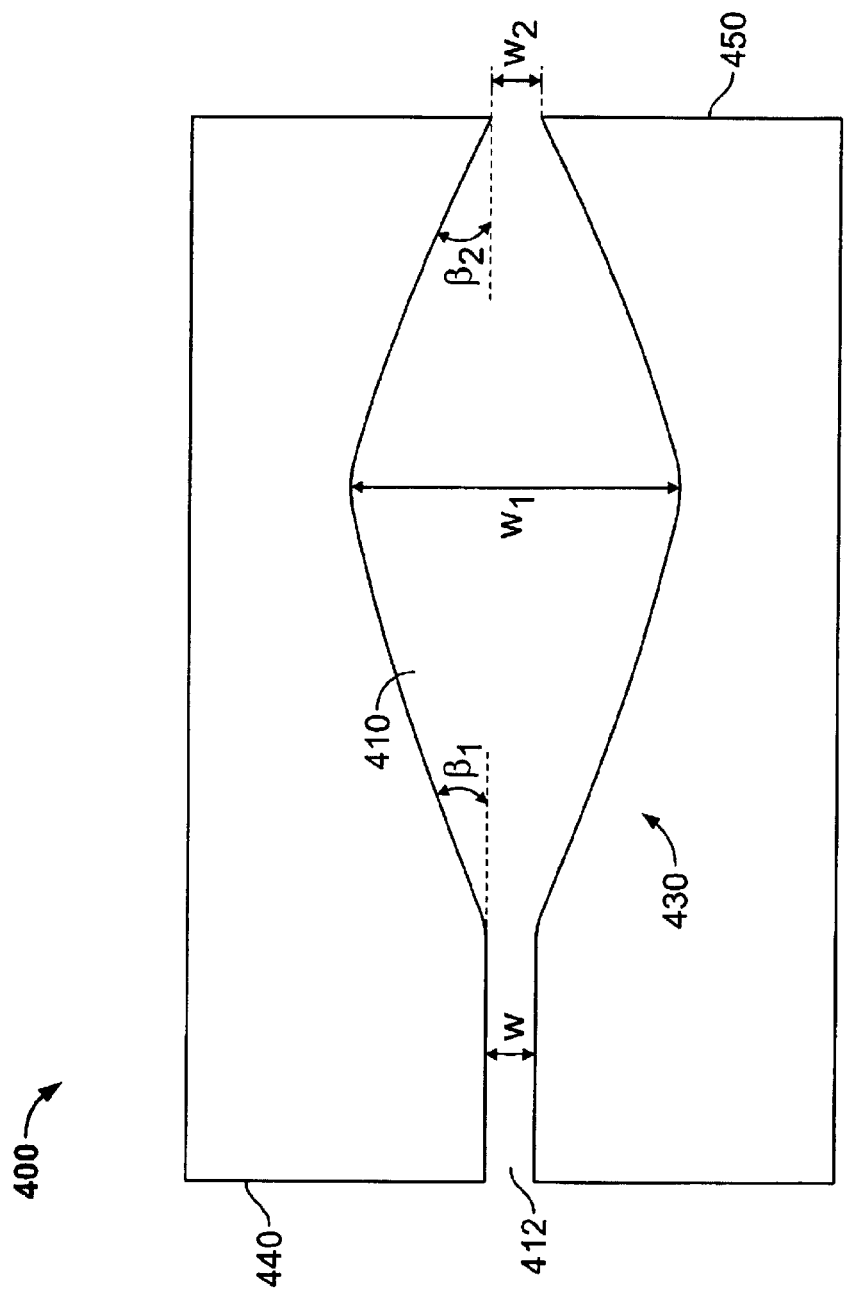
FIG. 4 illustrates another type of waveguide utilized according to yet another aspect of the present invention.

Referring now also to FIG. 4, according to another aspect of the present invention, the single-mode waveguide section 412 coupled to a diamond or taper 410 can also be applied without bending the waveguide of the structure 400 to make a high-power single-mode laser. In this case, both the front 450 and the back facets 440 are perpendicular to the waveguide structure 430. Again, the back facet 440 is coated with a high-reflect filter and the front facet 450 is coated with an anti-reflection layer to provide reflection on the order of a few percent. Such a structure can lase without external feedback, due to reflection provided by the back facet 400 and front facet 450. However, it should be recognized that the structure 400 is less suitable for external cavity lasers than the angled structure shown in FIG. 3. For external cavity operation, front facet reflection is preferably <0.001%. This is more easily achieved when the waveguide 430 is not perpendicular to the front facet 450. For example, the angled structure 300 of FIG. 3 which exhibits a 6° facet angle can provide reflection on the order of 0.001% to 0.0001%.

Still referring to FIG. 4, the portion 412 is preferably about 100 to 150 $\mu$m in length while the portion 410 is preferably about 2150 to 2200 $\mu$m in length. The portion 412 preferably has a width (w) of about 3 μm, while the region 410 has a maximum width ($w_1$) of about 38 μm and the width ($w_2$) of the waveguide at the output facet 450 is about 10 μm. The angle $\beta_1$ at which the taper of the region 410 expands is preferably about 1° while the angle $\beta_2$ at which the taper of the region 410 contracts is about 0.7°.

In U.S. Pat. No. 6,363,088, issued on Mar. 26, 2002, and entitled "ALL SOLID STATE HIGH POWER BROAD-BAND VISIBLE LIGHT SOURCE", also herein incorporated by reference, there is described an up-conversion laser including a high-power diamond infrared gain medium and a length of rare-earth-doped fluoride fiber inside a double cavity for high conversion efficiency. A fiber laser system 500 is shown in FIG. 5.

Figure 5:
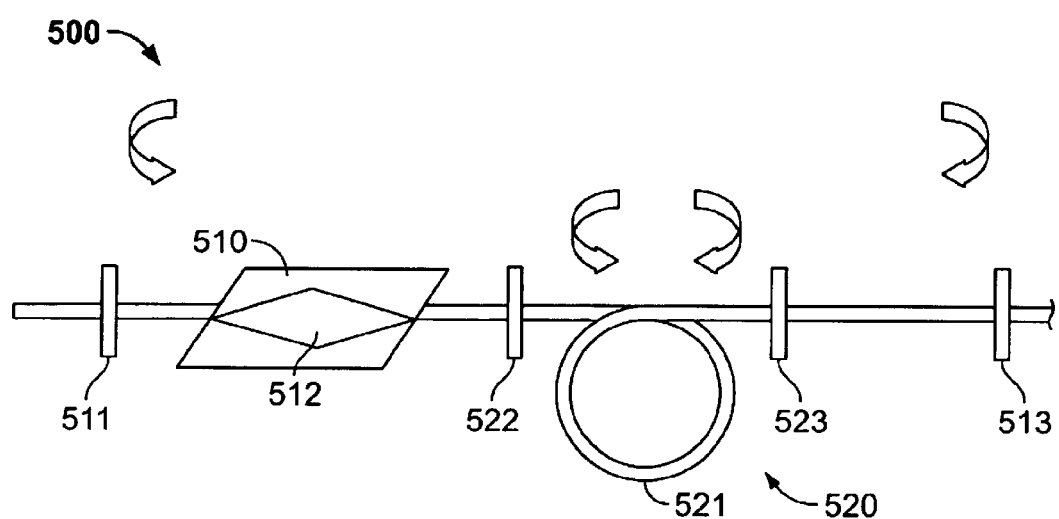
FIG. 5 illustrates a up-conversion fiber laser according to another aspect of the present invention.

Still referring to FIG. 5, this laser system 500 is a dual-cavity laser consisting of an infrared (IR) laser 510 of a type discussed hereto and that is pumped by an electric current, and a visible laser 520 that is pumped by the IR laser 510. The IR laser 510 includes a diamond-like SLD 512, a high-reflect mirror 511 on the left side of the diamond-like region 512, and another high-reflect mirror 513 on the far right in FIG. 5, on an opposite side of the visible laser 520 from the IR laser 510. IR light passes through the fiber 521 of the visible laser 520 and is partially absorbed by the rare-earth ions thereof to produce fluorescence at a corresponding wavelength in the visible spectrum. The visible laser 520 includes the up-conversion fiber 521, a high-reflect mirror 522 for the visible on the left side of the fiber 521, and a partial-reflect mirror 523 on the right side of the fiber 521. The mirrors 522, 523 are preferably interference mirrors and provide reflection only at the intended wavelength. Thus, the visible reflectors 522, 523 are transparent to the IR light, and vice-versa.

Figure 6:
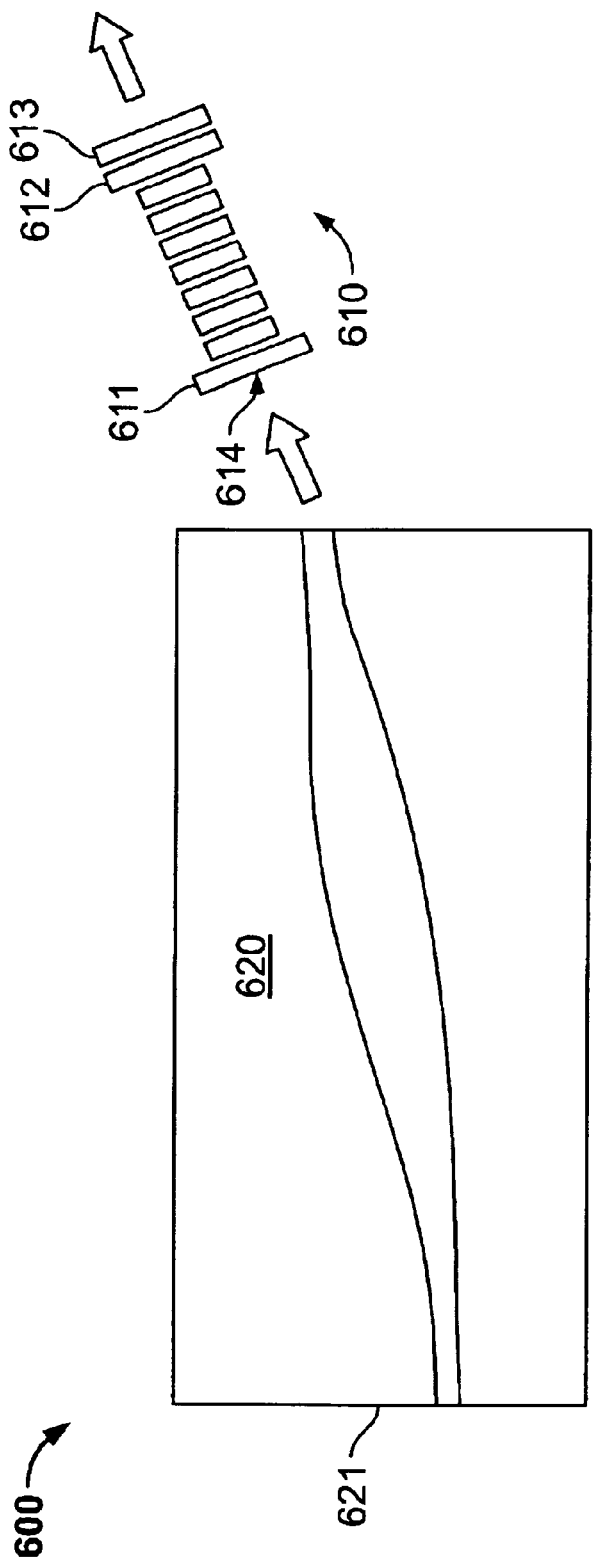
FIG. 6 illustrates an up-conversion laser utilizing a PPLN crystal according to another aspect of the present invention.

Referring now to FIG. 6, according to another aspect of the present invention the up-conversion fiber 521 and external reflectors 522, 523 are replaced by a crystal 610 such as a periodically-poled lithium niobate (PPLN) crystal 610, which includes a high-reflect visible light reflector 611 in the back facet 614 thereof, a high-reflect IR reflector 612 and a partial-reflect visible reflector 613. The configuration 600 of FIG. 6 also includes high-reflect reflector 621 on the back facet of the bent diamond-like SLD 620. Alternatively, a single tapered SLD could be used. FIG. 6 show an embodiment of the double-pass SLD dual cavity laser with the PPLN configured as a frequency converter. According to an aspect of the present invention, frequency conversion is obtained by frequency doubling due to the non-linearity of the PPLN material characteristics. For example, if the IR pump wavelength is in the 910–930 nm range, the process of frequency doubling generates blue light at 455 to 465 nm. Similarly, if the IR pump wavelength is at 1020 to 1040 nm, then the laser will generate a 510 to 520 nm green light.

A dual-cavity laser system according to the present invention is well suited for generating primary light sources for color projection systems. It is an advantageously compact, being a few centimeters in dimensions for example, point source which exhibits a low beam divergence, and is suitable for high efficiency projection systems, with high saturation colors and a long lifetime. According to another aspect of the present invention, such systems can produce visible output power in the 1 to 10 watt range.

Figure 7:
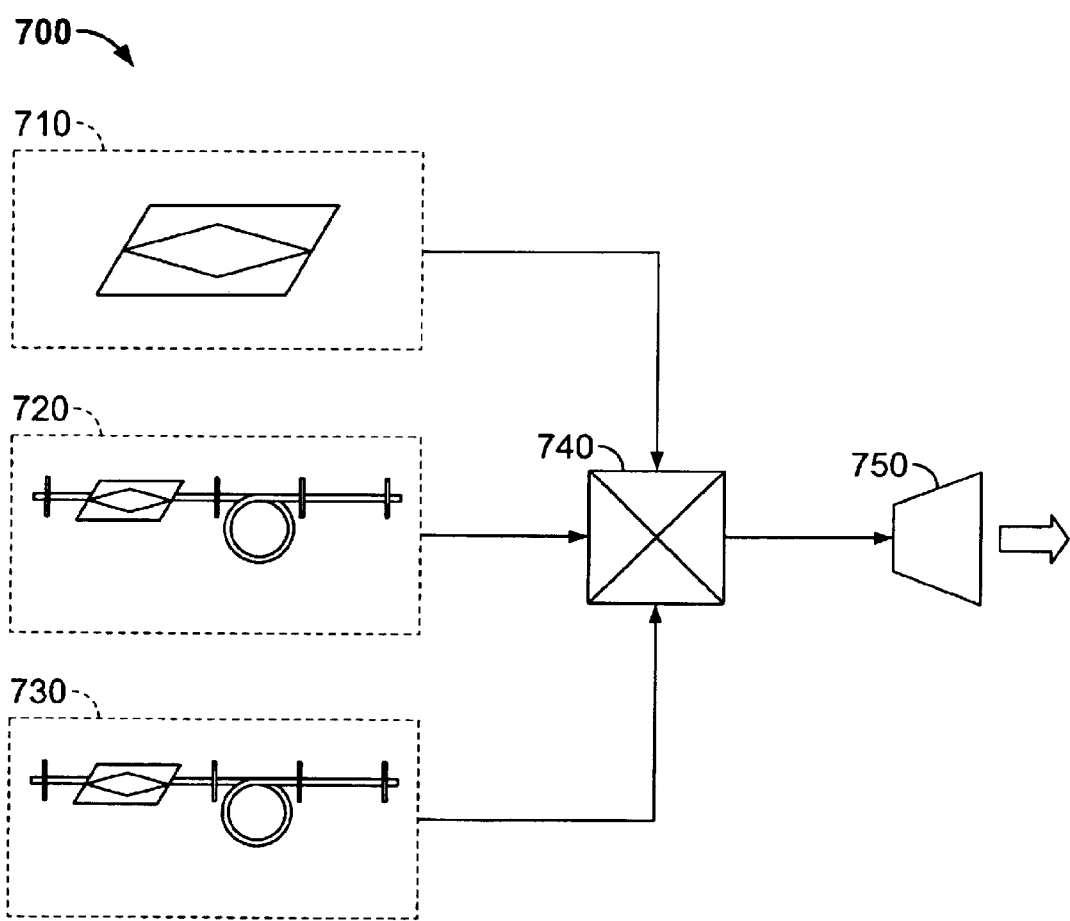
FIG. 7 illustrates a display system according to an aspect of the present invention; and, FIG. 8 illustrates modal reflectivity of an angled stripe SLD at 1550 nm wavelength for several lateral index steps.

Referring now to FIG. 7, according to yet another aspect of the present invention the light sources for a projection system 799 include one source of the type described in FIG. 5 or 6 with the appropriate IR wavelengths for the generation of blue and green, respectively 720, 730. While, according to another aspect of the present invention, a red primary beam can be generated directly from the semiconductor at 630 to 650 m using the structure 710 shown in FIG. 4, and discussed above, for example. Outputs from the sources 710, 720, 730 are supplied to a polarization cube 740 which feeds a projector 750, for example.

Although the invention has been described and pictured in a preferred form with a certain degree of particularity, it is understood that the present disclosure of the preferred form, has been made only by way of example, and that numerous changes in the details of construction and combination and arrangement of parts maybe made without departing from the spirit and scope of the invention as hereinafter claimed. It is intended that the patent shall cover by suitable expression in the appended claims, whatever features of patentable novelty exist in the invention disclosed.

What is claimed is:

1. An optical device comprising:
   a first facet;
   a second facet;
   an at least partially arcuate waveguide formed on a substrate and including a portion coextensive to said first facet, a portion that is not perpendicular to the first or second facet, and a light amplification region, said light amplification region including an expanding tapered portion and a contracting tapered portion within the portion of the waveguide that is not perpendicular to the first or second facet, wherein said contracting tapered portion approaches said second facet.

2. The device of claim 1, wherein said contracting region approaches said second facet of said optical device at an angle of about six degrees to perpendicular.

3. The device of claim 2, wherein said at least partially arcuate waveguide has a width of about three microns.

4. The device of claim 3, wherein said at least partially arcuate waveguide and amplification region are formed on a substrate including said first and second facets and an index of refraction difference between said at least partially arcuate waveguide and amplification region and said substrate ≦ approximately 0.01.

5. The device of claim 1, wherein said waveguide is a ridge waveguide.

6. The device of claim 1, wherein at least a portion of said at least partially arcuate waveguide has a radius of curvature sufficiently large to curtail radiation of a mode propagating through said waveguide due to the curvature thereof.

7. The device of claim 6, wherein said radius of curvature is on the order of 10 mm.

8. The device of claim 1, further comprising a fiber optic coupled to said tapered portion of said waveguide.

9. The device of claim 8, wherein said fiber is doped so as to perform upconversion of light passing through said second facet.

10. The device of claim 9, further comprising a first plurality of frequency selective reflectors coupled to said fiber.

11. The device of claim 10, further comprising a second plurality of frequency selective reflectors, each of said second plurality of reflectors coupled to one of said first plurality of reflectors.

12. The device of claim 11, wherein each of said first plurality of reflectors is highly reflective for at least one select frequency and highly transmissive for at least one other frequency.

13. The device of claim 12, wherein at least one of said second plurality of reflectors is highly reflective for at least one select frequency and highly transmissive for at least one other frequency.

14. The device of claim 13, wherein at least one other of said second plurality of reflectors is only partially reflective for said at least one select frequency that said at least one of said second plurality of reflectors is highly reflective.

15. The device of claim 1 further comprising a crystal coupled to said second facet for performing upconversion of light passing through said second facet.

16. The device of claim 15, wherein said crystal is a periodically poled lithium niobate crystal.

17. The device of claim 15, further comprising a first plurality of frequency selective reflectors coupled to said crystal.

18. The device of claim 17, further comprising a second plurality of frequency selective reflectors, each of said second plurality of reflectors coupled to one of said first plurality of reflectors.

19. The device of claim 18, wherein each of said first plurality of reflectors is highly reflective for at least one select frequency and highly transmissive for at least one other frequency.

20. The device of claim 19, wherein at least one of said second plurality of reflectors is highly reflective for at least one select frequency and highly transmissive for at least one other frequency.

21. The device of claim 20, wherein at least one other of said second plurality of reflectors is only partially reflective for said at least one select frequency that said at least one of said second plurality of reflectors is highly reflective.

22. The device of claim 1, further comprising a highly reflective coating on said first facet.

23. The device of claim 1, further comprising an anti-reflective coating on said second facet.

24. The device of claim 1, wherein a transition from said expanding tapered portion to said contracting tapered portion is gradual.

\* \* \* \* \*